(12) United States Patent
Hernandez et al.

(10) Patent No.: US 6,215,664 B1
(45) Date of Patent: Apr. 10, 2001

(54) METHOD AND APPARATUS FOR ARTICULATING A POWER SUPPLY IN A COMPUTER

(75) Inventors: David Hernandez; Robert D. Hrehor, Jr.; Gilberto Hernandez, all of Round Rock, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/276,626

(22) Filed: Mar. 25, 1999

(51) Int. Cl.[7] .................................................. H05K 7/16
(52) U.S. Cl. ........................ 361/725; 361/726; 361/727; 361/732
(58) Field of Search .................................... 361/679, 683, 361/724, 725, 726, 727, 728, 730, 731, 732

(56) References Cited

U.S. PATENT DOCUMENTS

| | | | |
|---|---|---|---|
| 4,223,371 | * | 9/1980 | Togneri ................................ 361/391 |
| 4,625,259 | | 11/1986 | Krechmer et al. . |
| 5,032,952 | | 7/1991 | Cooke et al. . |
| 5,159,528 | | 10/1992 | Murphy . |
| 5,169,221 | * | 12/1992 | Wheeler .............................. 312/323 |
| 5,172,305 | | 12/1992 | DeWilde . |
| 5,309,317 | * | 5/1994 | Ishikawa ............................ 361/609 |
| 5,584,396 | * | 12/1996 | Schmitt ................................ 211/26 |
| 5,612,854 | | 3/1997 | Wiscombe et al. . |
| 5,625,533 | * | 4/1997 | Kim et al. ............................ 361/681 |
| 5,745,342 | * | 4/1998 | Jeffries et al. ....................... 361/683 |
| 5,761,045 | | 6/1998 | Olson et al. . |
| 5,777,848 | | 7/1998 | McAnally et al. . |
| 5,784,251 | | 7/1998 | Miller et al. . |
| 5,790,372 | | 8/1998 | Dewey et al. . |

* cited by examiner

*Primary Examiner*—Leo P. Picard
*Assistant Examiner*—Hung Van Duong
(74) *Attorney, Agent, or Firm*—Haynes and Boone, L.L.P.

(57) ABSTRACT

A method and apparatus are described herein for mounting a power supply within a PC chassis such that it is ratchetably rotatable. The chassis includes a pivot receptacle, a hook, and a dimple. The power supply is received by a mounting bracket which includes a corresponding pivot point, a curved slot having a relatively wide portion disposed at one end for engaging the hook of the chassis and a relatively narrow portion for retaining the hook during rotation of the power supply, and a plurality of shorter slots oriented in a curve for engaging the dimple of the chassis thereby providing the ratcheting action and preventing the rotation of the power supply until force is applied.

In an alterative embodiment, the power supply is mounted to be translatable and rotatable. The chassis includes two cams, and a hook. The power supply is received by a mounting bracket which includes two cam slots each having a straight portion and a curved portion for engaging the cams of the chassis, and a straight slot having a relatively narrow portion that engages the hook of the chassis and a relatively wide portion that allows the hook to disengage from the slot. The hook and slot prevent rotation, ensuring the translational movement as the cams move along the straight portion of the cam slot. The cams reach the curved portion of the cam slots at the same time the hook reaches the relatively wide portion of its slot and disengages, thus allowing rotation. A lip disposed on the power supply supports the weight of the power supply, as well as helping guide the power supply during the translational motion.

25 Claims, 5 Drawing Sheets

METHOD AND APPARATUS FOR ARTICULATING A POWER SUPPLY IN A COMPUTER

BACKGROUND

This disclosure relates generally to personal computers ("PC's"), and more particularly to a PC having an articulated power supply, and a method for articulating said power supply.

Smaller computer designs require more efficient use of space within the chassis. Components are placed closer together, making it difficult to get to adjacent components for repair. Many PC's include power supplies for converting alternating current ("AC") to direct current ("DC"), which is used to operate the PC's components. Some power supplies for PC's are mounted directly to the chassis using screws. The associated inconveniences of this type of mounting technique might discourage designers from effectively using interior space.

A better method of mounting a power supply within a PC chassis enables the power supply to be rotated partly out of the chassis to provide access to adjacent components. This "swing out" power supply has been very successful. However, it is important to improve the design by reducing parts, increasing durability, and facilitating manufacture. Further, a long cable bundle is generally attached to the power supply to avoid disconnecting the power supply during service. With free rotating power supplies, there is a danger of compressing or scissoring the cable bundle if the power supply is abruptly rotated back into place.

Therefore, what is needed is an improved method and apparatus for mounting a power supply within a PC chassis requiring minimal space, yet displacing the power supply quickly and easily, and avoiding compression of the cable bundle when the power supply is rotated back into place, or obstructing a user's hands and tools in accessing components near the power supply.

SUMMARY

Accordingly, one embodiment disclosed herein is a method and apparatus for mounting a power supply within a PC chassis such that it is ratchetably rotatable. The chassis includes a pivot receptacle, a hook, and a dimple. The power supply is received by a mounting bracket which includes a corresponding pivot point, a curved slot having a relatively wide portion disposed at one end for engaging the hook of the chassis and a relatively narrow portion for retaining the hook during rotation of the power supply, and a plurality of shorter slots oriented in a curve for engaging the dimple of the chassis thereby providing the ratcheting action and preventing the rotation of the power supply until force is applied.

In an alterative embodiment, the power supply is mounted to be translatable and rotatable. The chassis includes two cams, and a hook. The power supply is received by a mounting bracket which includes two cam slots each having a straight portion and a curved portion for engaging the cams of the chassis, and a straight slot having a relatively narrow portion that engages the hook of the chassis and a relatively wide portion that allows the hook to disengage from the slot. The hook and slot prevent rotation, ensuring the translational movement as the cams move along the straight portion of the cam slot. The cams reach the curved portion of the cam slots at the same time the hook reaches the relatively wide portion of its slot and disengages, thus allowing rotation. A lip disposed on the power supply supports the weight of the power supply, as well as helping guide the power supply during the translational motion.

One advantage of the embodiments described herein is that components situated near the power supply are more easily accessible. Another advantage of the embodiments described herein is that they are easier to manufacture than previous designs.

Yet another advantage of the alternative embodiment described herein is that the cable bundle can be shorter than in previous designs, saving material.

DESCRIPTION OF THE PREFERRED EMBODIMENT

Figure 1:
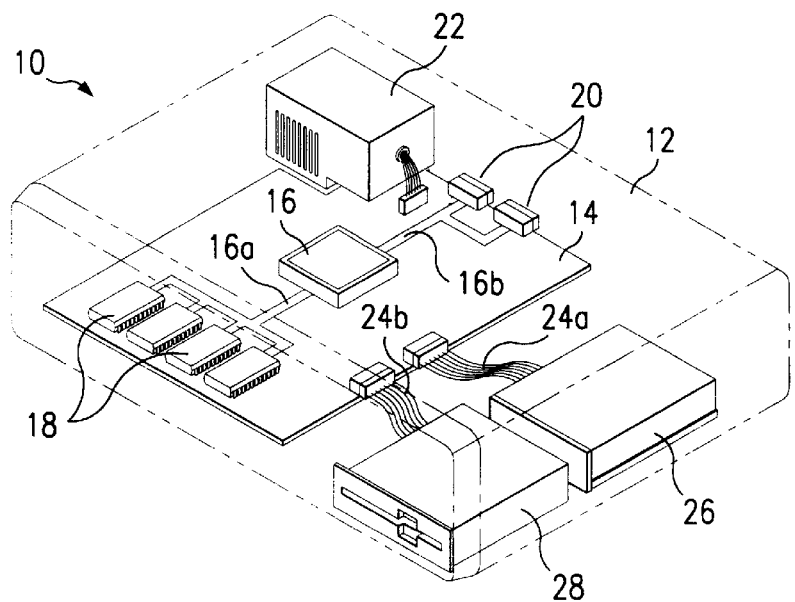
FIG. 1 is a schematic of the interior of a chassis of a PC.

FIG. 1 depicts a PC, designated generally by the reference numeral 10, which may be in the form of a desktop computer, a laptop computer or a tower computer, for example. The PC 10 includes a chassis 12, shown in phantom, in which a motherboard 14 is mounted. A processor 16, a plurality of memory devices or modules 18, and a plurality of input/output ("I/O") devices, represented in FIG. 1 by two input/output (I/O) devices 20, are mounted on the motherboard 14. Two buses 16a and 16b are also provided on the motherboard 14 and connect the processor 16 to the memory modules 18 and to the input/output devices 20, respectively. A power supply 22 is operably connected to the motherboard 14, and a pair of cable assemblies 24a and 24b connect the motherboard to a hard drive unit 26 and a disk drive unit 28, respectively. It is understood that other components, electrical traces, electrical circuits and related devices (not shown) are provided in the chassis 12. Since these are all conventional, they will not be described in any further detail.

Figure 2:
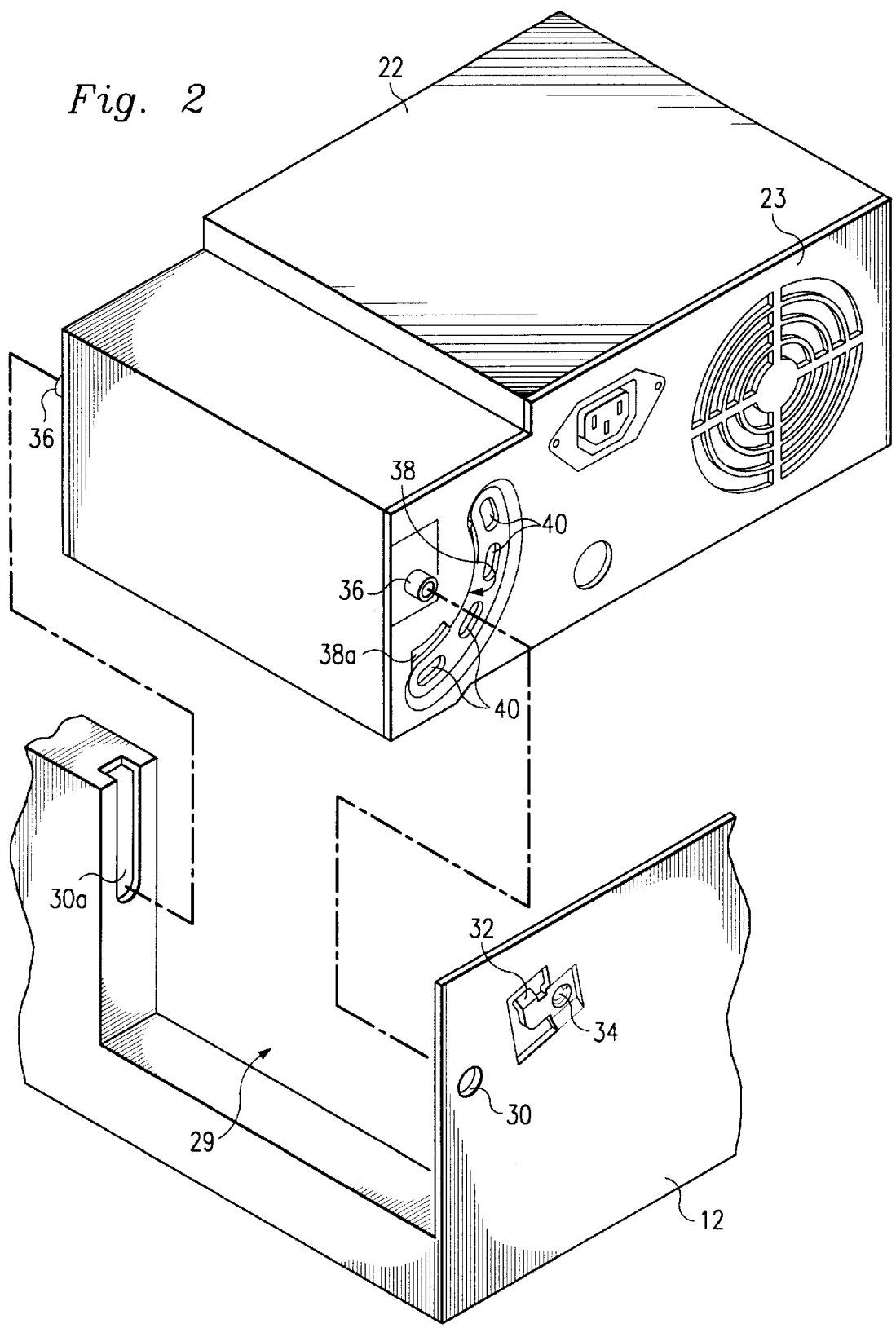
FIG. 2 illustrates an exploded view of an apparatus for mounting a power supply within a computer chassis.

FIG. 2 depicts an exploded view of an apparatus for mounting a power supply within a PC chassis such that it is ratchetably rotatable. The chassis 12 includes a pivot receptacle 30, and a pivot receptacle groove 30a oriented in a cutout 29 of the chassis wall. The chassis is made of plastic or some other moldable material. A tab or hook 32 and a rounded extrusion or dimple 34 are provided in the chassis and oriented inward relative to the computer interior for reasons to be described.

A power supply mounting bracket 23 receives the power supply 22, shown already attached, and is affixed by any known method. The bracket includes a pair of pivot points 36, corresponding to the pivot receptacle 30 and a pivot receptacle groove 30a of the chassis 12 for pivoting the power supply 22 inside the chassis. When engaged, the pivots rotatably mount the power supply in the chassis 12.

The bracket 23 also has a curved slot 38 having a relatively narrow portion (shown in FIG. 3) and a relatively wide portion 38a, which is oriented at one end. The hook 32 of the chassis engages the relatively wide portion 38a, and is retained in the relatively narrow portion. During rotation, the hook 32 is moved along the relatively narrow portion of curved slot 38, aligning the power supply and preventing binding.

Bracket 23 further includes a plurality of shorter slots 40 also oriented in a curve. For purposes of illustration only, four slots are shown. During rotation of the power supply with respect to the chassis, the dimple 34 of the chassis follows a corresponding curve, thereby engaging and passing over the slots 40 as is described below.

Figure 3:
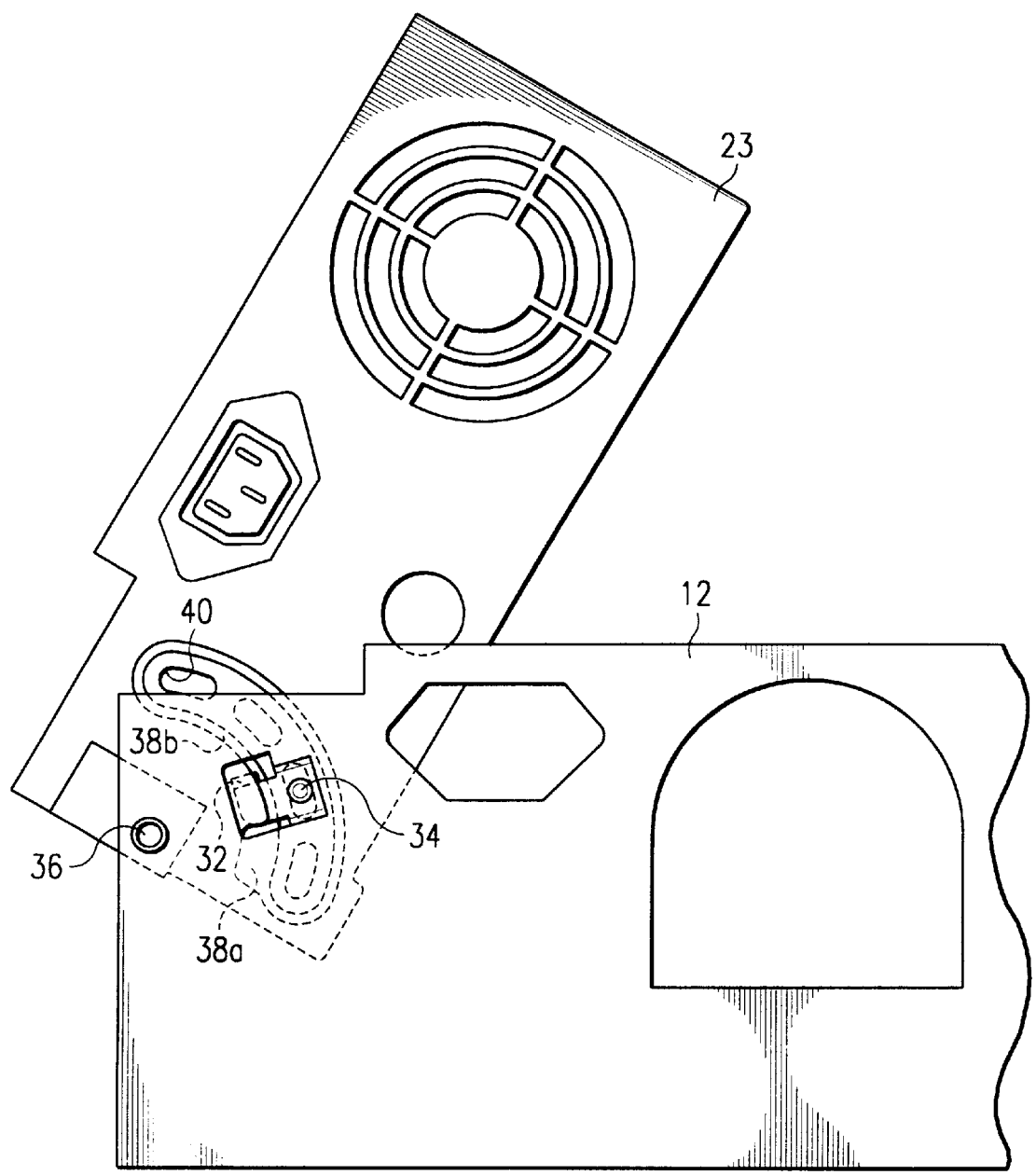
FIG. 3 shows the embodiment of FIG. 2 affixed in the chassis.

FIG. 3 shows the power supply bracket 23 mounted in the chassis 12 and in an outward rotated position relative to the chassis. Hook 32 is retained in the relatively narrow portion 38b of the curved slot. As shown, dimple 34 is engaged in one of the slots 40. When the dimple is engaged in a slot, the power supply is restrained, thereby hindering rotation of the power supply until force is applied. Movement and subsequent retention of the dimple 34 from slot to slot provides a ratcheting action, and provides several fixed intermediate positions to which the power supply can be rotated between the mounted position in the chassis and the fully outwardly rotated position. One advantage of such a method is that it prevents the power supply from slamming shut, which could injure a service or assembly person, and could also result in scissoring the cable bundle.

Figure 4:
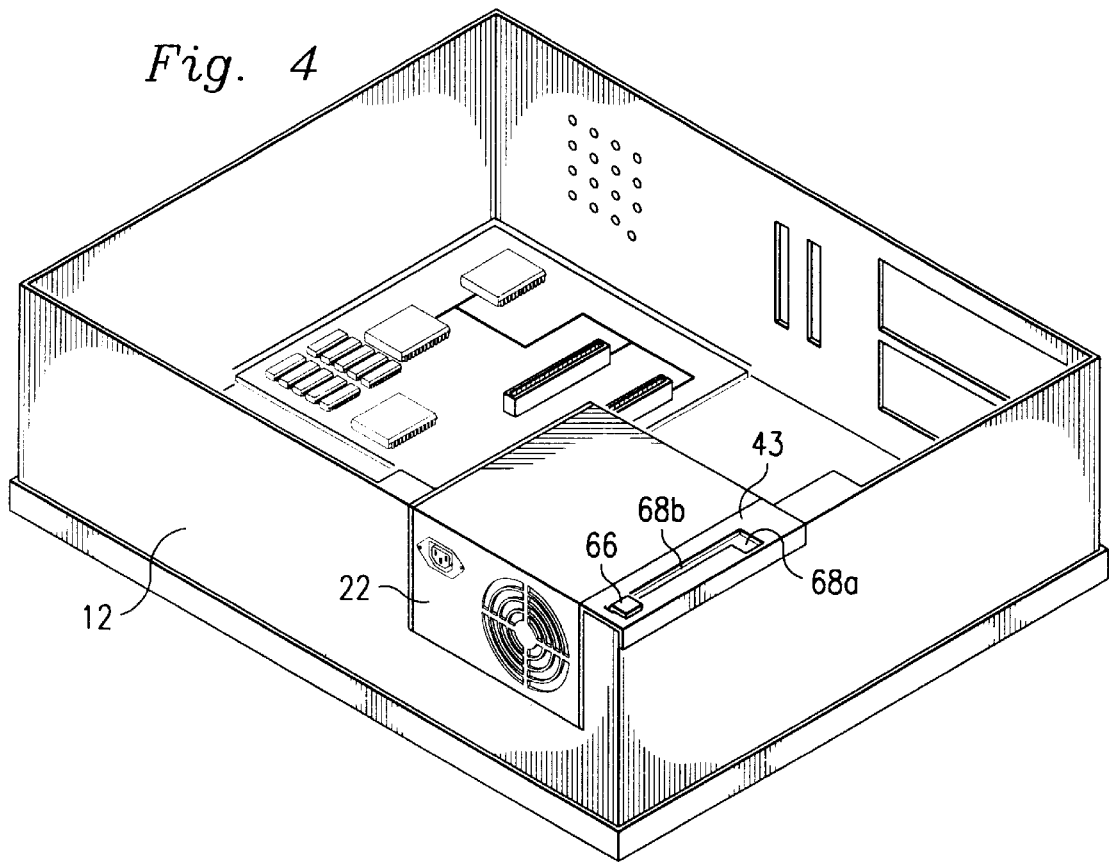
FIG. 4 illustrates an alternative embodiment of an apparatus for mounting a power supply within a computer chassis.
Figure 5:
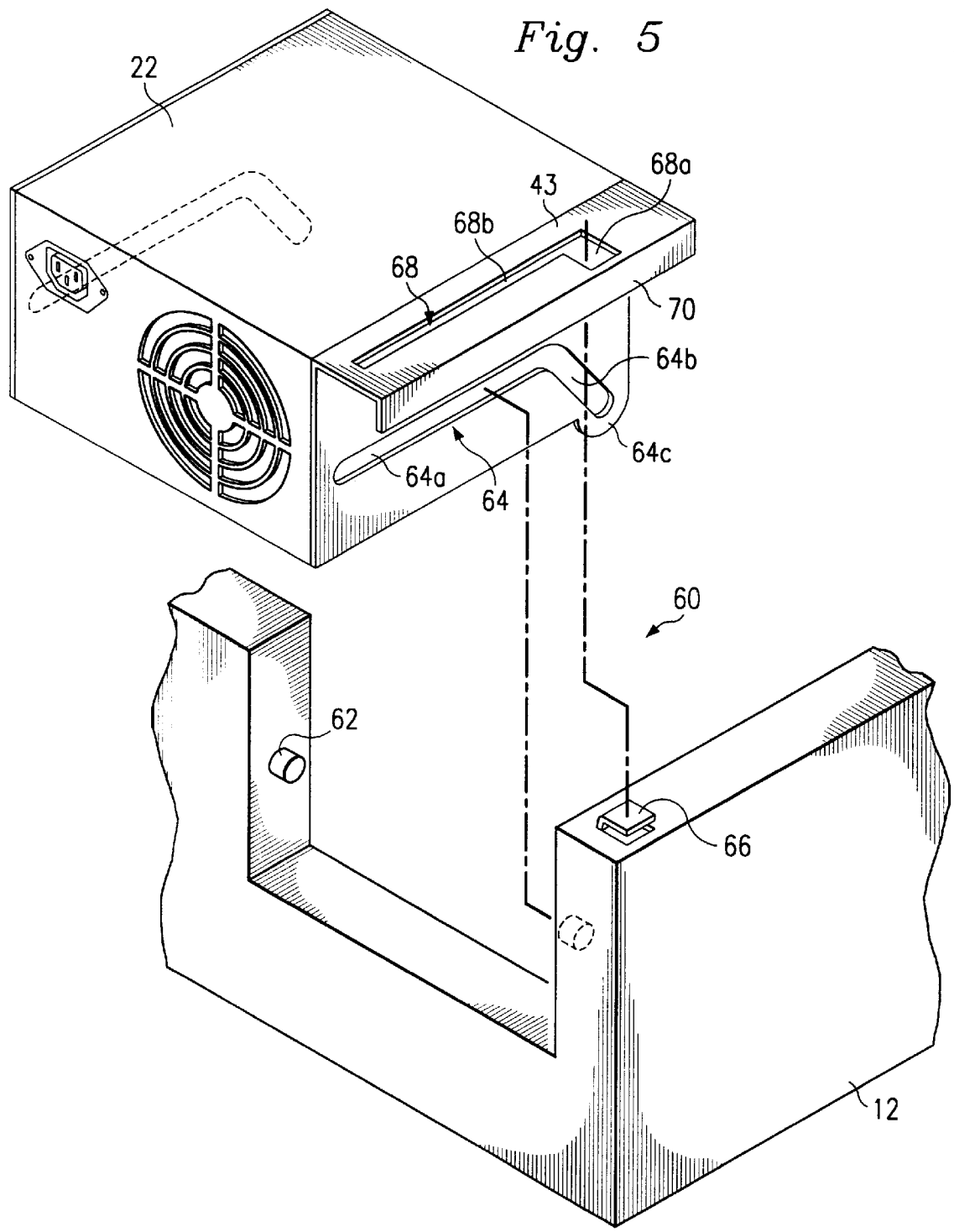
FIG. 5 is an exploded view of FIG. 4.

FIGS. 4, 5, and 6 depict an alternative apparatus for connecting the power supply 22 to the chassis 12. As shown in FIG. 5, a pair of cams 62 are disposed on the chassis. A hook 66 disposed on the chassis 12 forms part of a hook and slot arrangement, to be described, between the chassis and power supply.

Figure 6A:
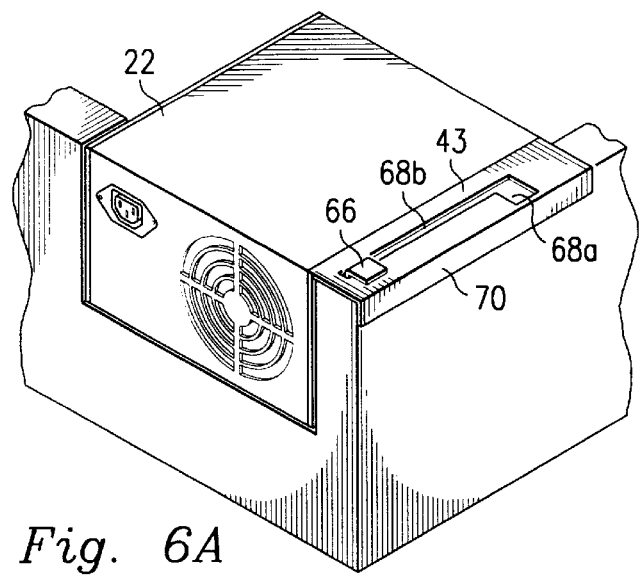
FIGS. 6A–6C illustrate a method of using the apparatus of FIG. 4 to articulate the power supply out of the chassis.

A power supply mounting bracket 43 receives the power supply 22, shown attached, and is affixed by any known method. FIGS. 4 and 6A show the power supply 22 in a mounted position. Cam slots 64 are disposed on the bracket 43.

In operation, the corresponding cams 62 of the chassis slide along the cam slots 64. Each of the cam slots 64 has a straight portion 64a, a curved portion 64b ending in an outward projection of the bracket 64c.

Figure 6B:
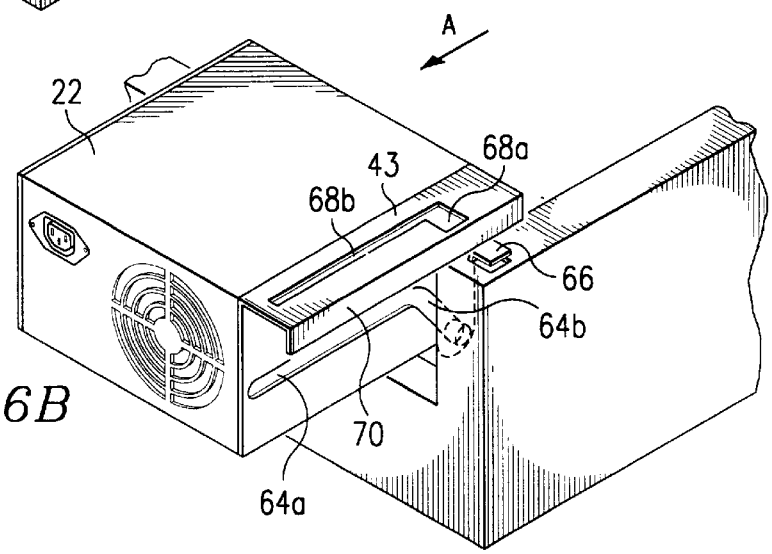

When the power supply is translated away from the chassis 12, it follows the initial straight portion 64a of the cam slot. FIG. 6B shows the power supply 22 being translated in a direction designated by arrow A.

Figure 6C:
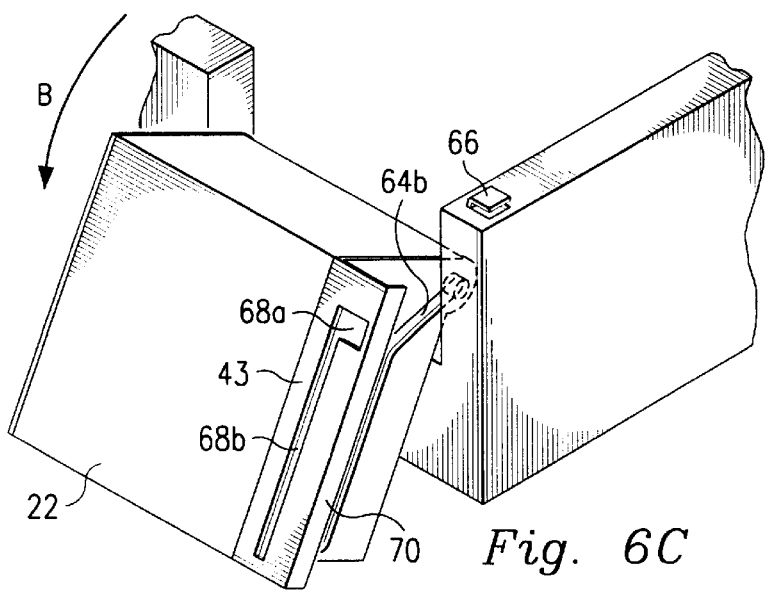

As the cams reach the curved portion 64b of the cam slot, the power supply is then rotated. FIG. 6C shows the power supply 22 being rotated in a direction designated by arrow B. The outward projection of the bracket 64c allows the slot to extend far enough for the power supply to finish rotation in a position well outside the chassis.

Regarding FIG. 5, the bracket 43 also has a slot 68 having a relatively wide portion 68a and a relatively narrow portion 68b. In operation, the relatively wide portion 68a of the slot receives the hook 66 of the chassis, while the relatively narrow portion 68b then retains the received hook 66. The power supply 22 is restrained from rotational movement relative to the chassis 12 when the hook 66 is retained in the relatively narrow portion 68b of the slot, and only translational movement is possible. However, when the hook 66 is aligned with the relatively wide portion 68a, the hook disengages, and the power supply is permitted to rotate relative to the chassis. The hook 66 does not disengage from the slot until in a position equivalent to where the cams 62 reach the curved portion 64b of the cam slots 64.

A lip 70 is disposed on the bracket 43 for supporting the weight of the power supply, as well as helping guide the power supply during the translational motion.

This disclosure shows and describes illustrative embodiments, however, the disclosure contemplates a wide range of modifications, changes and substitutions. Such variations may employ only some features of the embodiments without departing from the scope of the underlying embodiment. Accordingly, any appropriate construction of the appended claims will reflect the broad scope of the underlying embodiment.

What is claimed is:

1. A computer comprising:
   a chassis,
   a power supply disposed in the chassis,
   a mounting bracket adapted to receive the power supply for mounting the power supply within the chassis,
   at least one extrusion on the chassis for engaging the bracket,
   means disposed on the bracket for receiving said at least one extrusion, thereby allowing rotational movement of the power supply between a position in which the power supply rests in the chassis and a position in which the power supply extends out of the chassis, and
   a hook and slot arrangement for guiding said movement, the slot having a relatively wide portion that receives the hook and a relatively narrow portion that retains the hook within the slot.

2. The computer of claim 1 wherein the means are a plurality of discrete slots arranged in a curve on the mounting bracket, and the at least one extrusion is a dimple on the chassis to selectively engage the plurality of discrete slots, wherein each time the dimple is engaged in one of the discrete slots, the power supply is restrained from rotational movement, thereby providing ratcheting movement of the power supply while rotating.

3. The computer of claim 1 wherein the means are a pair of cam slots disposed on the bracket, and the at least one extrusion is a pair of corresponding cams disposed on the chassis for guiding translational and rotational movement of the power supply relative to the chassis, wherein each of the cam slots includes a straight portion that guides the corresponding cam during translational movement and a curved portion that guides the corresponding cam during rotational movement.

4. The computer of claim 2 wherein the hook and slot arrangement comprises a hook disposed on the chassis and a slot disposed on the bracket, wherein the relatively narrow portion of the slot is curved for guiding the power supply during rotation.

5. The computer of claim 3 wherein the hook and slot arrangement comprises a hook disposed on the chassis and a slot disposed on the bracket, wherein the power supply translates but is restrained from rotational movement while the hook is retained in the relatively narrow portion of the hook slot and the power supply is permitted to rotate relative to the chassis when the hook is disposed within the relatively wide portion of the hook slot.

6. The computer of claim 3 wherein the cams contact the curved portion of the cam slots coincident to the hook meeting the relatively wide portion of the hook slot.

7. A computer comprising:
   a chassis,
   a power supply disposed in the chassis,
   a mounting bracket adapted to receive the power supply for pivotally mounting the power supply within the chassis,
   a plurality of discrete slots arranged in an arc on the mounting bracket for ratcheting movement of the power supply while rotating between a position in which the power supply rests in the chassis and a position in which the power supply extends out of the chassis, a dimple on the chassis to selectively engage the plurality of discrete slots, wherein each time the dimple is engaged in one of the discrete slots, the power supply is restrained from rotational movement at predetermined positions, and a hook and slot arrangement associated with the chassis and mounting bracket for guiding rotational movement of the power supply during pivoting of the power supply relative to the chassis.

8. The computer of claim 7 wherein a pair of extrusions on the mounting bracket engages openings in the chassis to pivotally mount the power supply within the chassis.

9. The computer of claim 7 wherein the hook and slot arrangement includes a slot having a relatively wide portion that receives the hook and a relatively narrow portion that retains the hook within the slot.

10. The computer of claim 9 wherein the relatively narrow portion of the slot is curved.

11. A method for installing a power supply unit in a computer unit comprising the steps of:

inserting extrusions of one unit into openings in the other unit, inserting a hook of one unit into a curved slot of the other unit, wherein insertion is at a relatively wide portion of the slot, rotating one unit relative to the other unit thereby moving the hook along a relatively narrow portion of the curved slot, and aligning a dimple on one unit and a plurality of additional discrete slots arranged in a curve on the other unit, said step of rotating causing the dimple to move from one discrete slot to the next discrete slot, thereby ratcheting one unit relative to the other unit, wherein the power supply is restrained from rotational movement relative to the chassis when the dimple is in one of the discrete slots.

12. A computer comprising:

a chassis, a power supply disposed in the chassis, a mounting bracket adapted to receive the power supply for mounting the power supply within the chassis, a cam mechanism for guiding translational and rotational movement of the power supply with respect to the chassis, and comprising a pair of cams disposed on the chassis and a pair of corresponding cam slots disposed on the bracket, and a hook and slot arrangement comprising a hook disposed on the chassis and a corresponding hook slot disposed on the bracket, said slot having a relatively wide portion that receives the hook and a relatively narrow portion that retains the received hook.

13. The computer of claim 12 wherein each of the cam slots includes a straight portion that guides the cam during translational movement of the power supply and a curved portion that guides the cam during rotational movement of the power supply.

14. The computer of claim 12 wherein the power supply translates but is restrained from rotational movement while the hook is retained in the relatively narrow portion of the hook slot and wherein the power supply is free to rotate when the hook is disposed within the relatively wide portion of the hook slot.

15. The computer of claim 12 further comprising a lip disposed on the bracket for supporting and guiding the power supply during translational movement thereof.

16. The computer of claim 14 wherein the curved portion of each of the cam slots coincides with the relatively wide portion of the hook slot for allowing rotational movement and the straight portion of the cam slots coincides with the relatively narrow portion of the hook slot for guiding the power supply in translational movement.

17. A method for installing a power supply unit in a computer unit comprising the steps of:

inserting cams of one unit into cam slots of the other unit, inserting a hook of one unit into a hook slot of the other unit, wherein insertion is at a relatively wide portion of the hook slot, translating the power supply by moving the cams along a straight portion of the cam slots, wherein the step of translating causes the hook to move from the relatively wide portion of the hook slot to a relatively narrow portion thereof to retain the hook, wherein the power supply is restrained from rotational movement when the hook is retained within the relatively narrow portion of the hook slot, moving the hook to the relatively wide portion of the hook slot to permit rotational movement of the power supply to enable access to an interior of the computer, and rotating one unit relative to the other unit thereby moving the cams along a curved portion of the cam slots.

18. A computer comprising:

a power supply;

a chassis for receiving the power supply, and having a pivot receptacle and a dimple disposed adjacent to the receptacle;

a mounting bracket disposed between the power supply and the chassis to ratchetably rotate the power supply between a position in which the power supply rests in the chassis and a position in which the power supply extends out of the chassis, the mounting bracket comprising:

(i) a pivot point for engaging the receptacle of the chassis; and (ii) a plurality of discrete slots arranged in an arc relative to the pivot point, such that when rotational force is applied to the power supply, the dimple of the chassis selectively engages each of the discrete slots in turn, thereby restraining the power supply from further rotational movement until additional rotational force is supplied.

19. The computer of claim 18 further comprising a hook and slot arrangement associated with the chassis and mounting bracket for guiding rotational movement of the power supply during pivoting of the power supply relative to the chassis.

20. The computer of claim 19 wherein the hook and slot arrangement includes a slot having a relatively wide portion that receives the hook and a relatively narrow portion that retains the hook within the slot.

21. The computer of claim 19 wherein the slot is curved in an arc corresponding to the arc formed by the discrete slots.

22. A computer comprising:

a power supply;

a chassis for receiving the power supply, and having a pair of cams for guiding translational and rotational movement of the power supply with respect to the chassis to move the power supply between a position in which the power supply rests in the chassis and a position in which the power supply extends out of the chassis;

a mounting bracket disposed between the power supply and the chassis, the mounting bracket having a pair of corresponding cam slots disposed on the bracket, wherein each of the cam slots includes a straight portion that guides the cam during translational movement of the power supply and a curved portion that guides the cam during rotational movement of the power supply; and a hook and slot arrangement comprising a hook disposed on the chassis and a corresponding hook slot disposed on the mounting bracket, wherein the slot has a relatively wide portion that receives the hook and a relatively narrow portion that retains the received hook, and wherein the power supply translates but is restrained from rotational movement while the hook is retained in the slot.

23. The computer of claim 22 wherein the power supply is free to rotate when the hook is disposed within the relatively wide portion of the hook slot.

24. The computer of claim 22 further comprising a lip disposed adjacent to the slot on the bracket for supporting and guiding the power supply during translational movement thereof.

25. The computer of claim 23 wherein the curved portion of each of the cam slots coincides with the relatively wide portion of the hook slot for allowing rotational movement and the straight portion of the cam slots coincides with the relatively narrow portion of the hook slot for guiding the power supply in translational movement.

* * * * *